(12) United States Patent
Chen (10) Patent No.: US 11,201,181 B2
(45) Date of Patent: Dec. 14, 2021

(54) IMAGE SENSOR OF FINGERPRINT

(71) Applicant: NOVATEK Microelectronics Corp., Hsin-Chu (TW)

(72) Inventor: Chi-Ting Chen, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 17/078,060

(22) Filed: Oct. 22, 2020

(65) Prior Publication Data
US 2021/0043667 A1 Feb. 11, 2021

Related U.S. Application Data

(63) Continuation of application No. 16/436,905, filed on Jun. 10, 2019, now Pat. No. 10,854,648.

(60) Provisional application No. 62/779,489, filed on Dec. 14, 2018.

(51) Int. Cl.
*H01L 27/146* (2006.01)

(52) U.S. Cl.
CPC .. *H01L 27/14605* (2013.01); *H01L 27/14607* (2013.01); *H01L 27/14636* (2013.01); *H01L 27/14678* (2013.01)

(58) Field of Classification Search
CPC ....... H01L 27/14601–14607; H01L 27/14636; H01L 27/14643; H01L 27/14678
See application file for complete search history.

(56) References Cited

U.S. PATENT DOCUMENTS

| 2006/0132633 | A1 | 6/2006 | Nam |
| 2006/0273364 | A1 | 12/2006 | McGrath |
| 2013/0294037 | A1 | 11/2013 | Kuriki |

FOREIGN PATENT DOCUMENTS

| EP | 2 720 119 A2 | 4/2014 |
| EP | 2 401 669 B1 | 4/2016 |
| TW | 201145180 A1 | 12/2011 |
| WO | 2017/149941 A1 | 9/2017 |

*Primary Examiner* — Robert G Bachner
*Assistant Examiner* — Molly K Reida
(74) *Attorney, Agent, or Firm* — Winston Hsu (57) ABSTRACT

An image sensor includes a sensor layer and a metal layer. The sensor layer includes a plurality of sensing elements arranged as a 2-dimensional array along a first direction and a second direction. The metal layer includes a plurality of metal wires configured to form a plurality of apertures superposed on the plurality of sensing elements. At least one of the plurality of metal wires forming the plurality of apertures is entirely disposed along a third direction different from the first direction and the second direction.

18 Claims, 6 Drawing Sheets

IMAGE SENSOR OF FINGERPRINT

CROSS REFERENCE TO RELATED APPLICATIONS

This application is a continuation application of U.S. application Ser. No. 16/436,905, filed on Jun. 10, 2019, which claims the benefit of U.S. Provisional Application No. 62/779,489, filed on Dec. 14, 2018. The contents of these applications are incorporated herein by reference.

BACKGROUND OF THE INVENTION

1. Field of the Invention

The present invention relates to an image sensor, and more particularly, to an image sensor of fingerprint.

2. Description of the Prior Art

With advancements in technology, mobile devices such as smart phones, tablets, laptops, GPS navigation systems and electronic books have become indispensable in our daily life. Compared with conventional mobile phones that only have communication functions, modern mobile devices combine various functions such as communication, networking, photographing, games and data processing. This type of multifunctional design is more attractive to consumers. Fingerprint recognition is a popular function for security and privacy in various electronic devices, including mobile devices, and can be implemented in different techniques such as capacitance sensing, optical (image sensing), thermal, ultrasonic, etc. For example, a mobile phone may have a fingerprint recognition interface built into a home button or in a dedicated region to detect user fingerprint.

Figure 1:
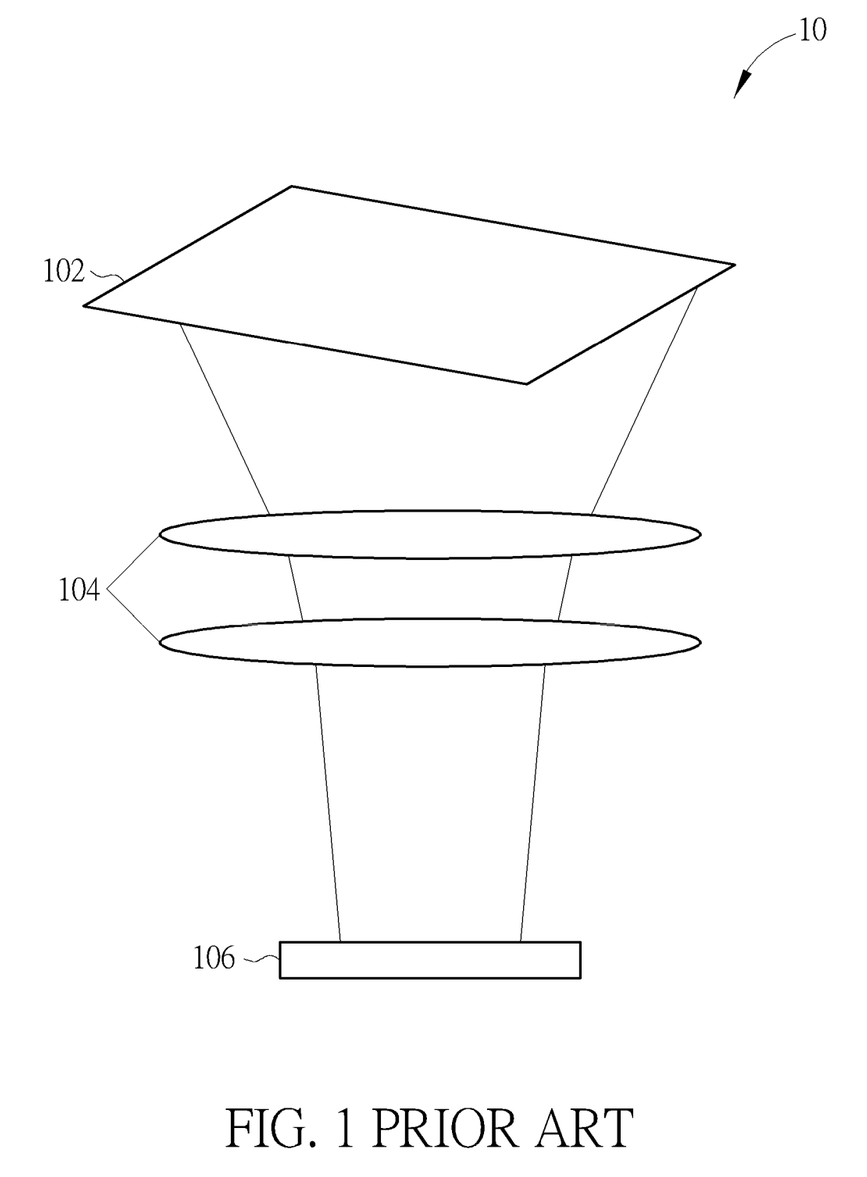
FIG. 1 is a schematic diagram of the structure of an optical fingerprint recognition system.

In recent years, the optical fingerprint recognition has become one of the most popular fingerprint recognition schemes. Please refer to FIG. 1, which is a schematic diagram of the structure of an optical fingerprint recognition system 10. The optical fingerprint recognition system 10 includes a touch panel 102, at least one lens 104 and a sensor integrated circuit (IC) 106. The touch panel 102 is configured to contact the finger of a user to receive the fingerprint image. The image is then forwarded to the sensor IC 106 via the lens 104. In general, if the optical fingerprint recognition system 10 is integrated with a display device such as an organic light-emitting diode (OLED) panel, the panel structure of the display device may be superposed on the lens 104 or the sensor IC 106, to interfere with the sensed fingerprint image, e.g., blocking parts of the light reflected from the touch finger. In other words, the light reflected from the touch finger may pass through devices in the image pixel array of the OLED and then be sensed by the sensing pixels included in the sensor IC 106.

Figure 2:
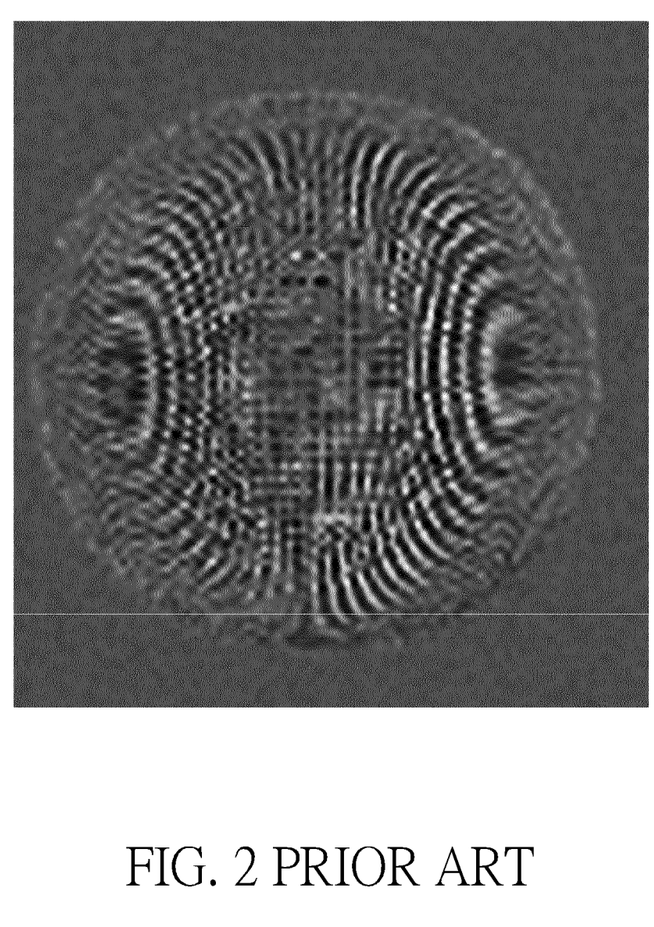
FIG. 2 illustrates an exemplary fingerprint image interfered with the moiré pattern.

In general, each pixel of the display panel has the same structure, to generate a plurality of light paths having similar texture arranged as an array. The sensing pixels in the sensor IC 106 are also arranged as an array, and each sensing pixel has a sensing area capable of receiving lights. If the dimensions of the image pixel array of the display device are close to the dimensions of the sensing pixel array of the sensor IC 106, moiré pattern may appear since the light sensed by the sensor IC 106 passes through grille patterns of both the display panel and the sensing area. The moiré effect degrades the quality and resolution of the fingerprint image. FIG. 2 illustrates an exemplary fingerprint image interfered with the moiré pattern, where redundant arc lines other than the fingerprint may appear.

Figure 3:
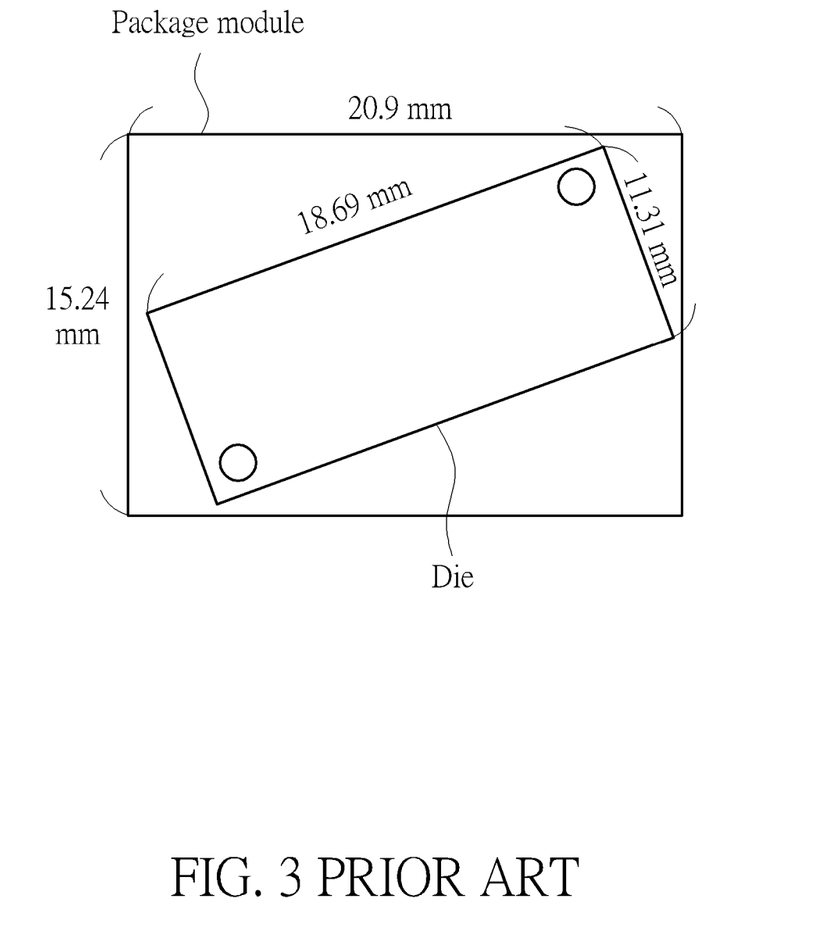
FIG. 3 is a schematic diagram of a package module including the sensor IC.

In order to mitigate the problem of moiré pattern, the die of the sensor IC 106 may be disposed with a turning angle in the package module, as shown in FIG. 3. However, the turning disposition scheme results in significant increasing of chip size. In an example as shown in FIG. 3, the die size is 18.69 mm×11.31 mm, and the total chip size including the package is 20.9 mm×15.24 mm, where the chip area is expanded since the die is disposed with a turning angle. Thus, there is a need for improvement over the prior art.

SUMMARY OF THE INVENTION

It is therefore an objective of the present invention to provide a fingerprint image sensor, which is capable of solving the problem of moiré pattern without increasing the chip size of the sensor integrated circuit (IC).

An embodiment of the present invention discloses an image sensor, which comprises a sensor layer and a metal layer. The sensor layer comprises a plurality of sensing elements arranged as a 2-dimensional array along a first direction and a second direction. The metal layer comprises a plurality of metal wires configured to form a plurality of apertures superposed on the plurality of sensing elements. At least one of the plurality of metal wires forming the plurality of apertures is entirely disposed along a third direction different from the first direction and the second direction.

Another embodiment of the present invention discloses an image sensor, which comprises a sensor layer and a metal layer. The sensor layer comprises a plurality of sensing elements arranged as a 2-dimensional array along a first direction and a second direction, the plurality of sensing elements having a plurality of borders. The metal layer comprises a plurality of metal wires configured to form a plurality of apertures superposed on the plurality of sensing elements. A majority of the borders of the plurality of sensing elements are disposed along a third direction and a fourth direction different from the first direction and the second direction.

Another embodiment of the present invention discloses an image sensor. The image sensor comprises a sensor layer and a metal layer. The sensor layer comprises a plurality of sensing elements divided into a plurality of groups, wherein the plurality of groups are arranged as a 2-dimensional array along a first direction and a second direction. The metal layer comprises a plurality of metal wires configured to form a plurality of apertures superposed on the plurality of sensing elements. The sensing elements in each of the plurality of groups are arranged as a 2-dimensional array along a third direction and a fourth direction, wherein each of the third direction and the fourth direction is different from the first direction and the second direction.

These and other objectives of the present invention will no doubt become obvious to those of ordinary skill in the art after reading the following detailed description of the preferred embodiment that is illustrated in the various figures and drawings.

DETAILED DESCRIPTION

As mentioned above, the chip size increases because the die is turned by an angle inside the package module. In order to effectively mitigate the moiré effect, the die should be turned by at least 15 degrees, and hence the increasing area becomes significant.

In order to deal with the moiré effect while maintaining the chip size at a satisfactory level, the present invention turns the sensing element in each pixel or turns the metal layers forming the sensing light path instead of turning the die. In such a situation, the interference of moiré pattern on the fingerprint image may be mitigated or eliminated, and there is no need to turn the disposition of die inside the package module, allowing the sensor integrated circuit (IC) to have a smaller chip size.

Figure 4:
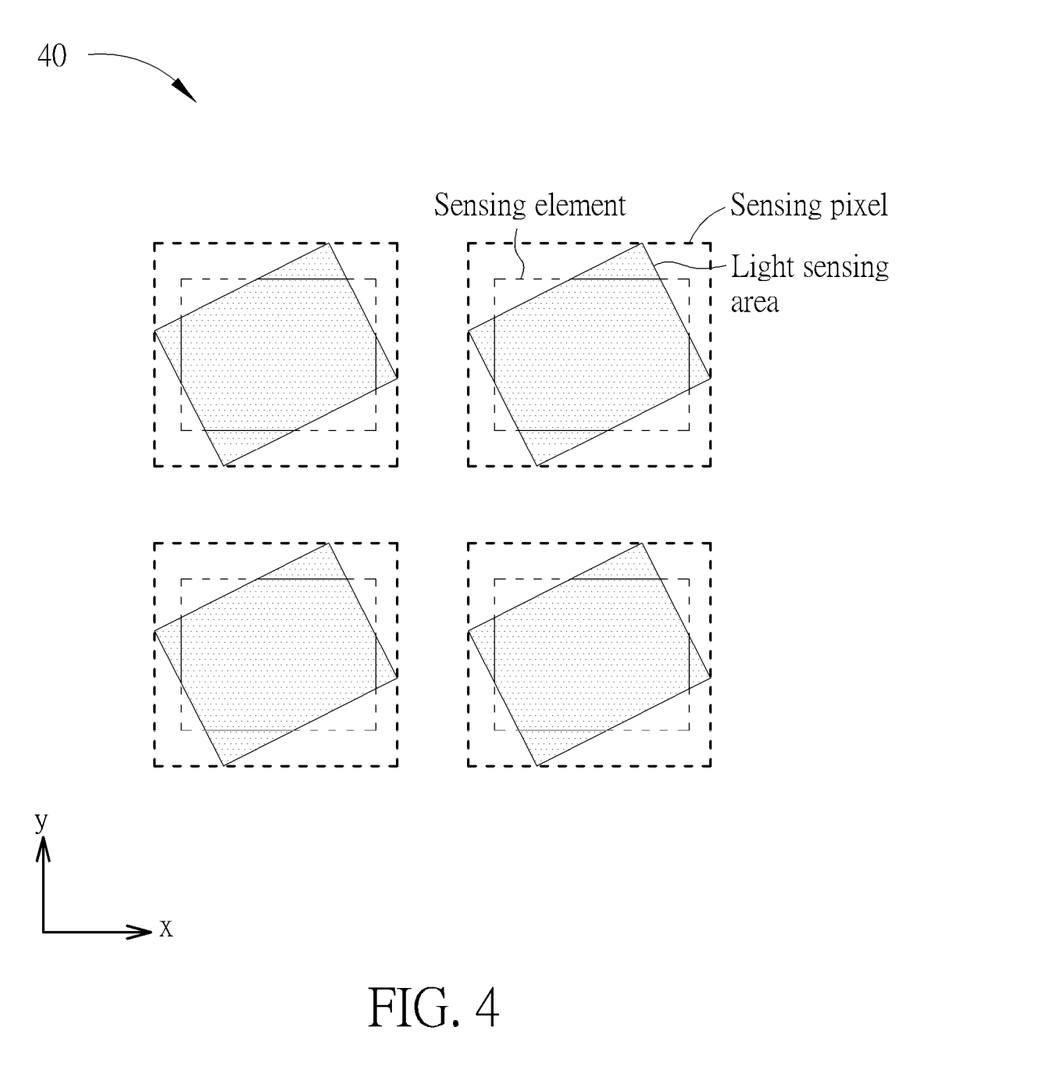
FIG. 4 is a schematic diagram of an image sensor according to an embodiment of the present invention.

Please refer to FIG. 4, which is a schematic diagram of an image sensor 40 according to an embodiment of the present invention. As shown in FIG. 4, the image sensor 40, which may be a sensor IC, includes a plurality of sensing pixels arranged as a 2-dimensional array. For the purpose of simplicity, only 4 sensing pixels are illustrated. Nevertheless, those skilled in the art should understand that there may be hundreds or thousands of sensing pixels in the image sensor 40. Each sensing pixel includes a sensing element such as a photodiode, which is capable of receiving lights and converting lights into electrons. The electrons may be outputted in the form of any electronic signals such as voltages or currents and then be converted into digital image data to be processed by a processor or host device so as to construct the fingerprint image. Each sensing pixel further includes a light sensing area that may be defined by an aperture formed by metal wires. In other words, the image sensor 40 includes a sensor layer and at least one metal layer, where the sensor layer has the sensing elements in the pixels, and the metal layer includes metal wires configured to form apertures superposed on the sensing elements in the sensor layer, where each aperture is configured to pass lights to one of the sensing elements. Therefore, the lights reflected from the touch finger may pass through the apertures and then be received by the sensing elements. The sensing pixels may further include several circuit elements such as transistors and capacitors, which are omitted in FIG. 4 without influencing the illustrations of the present embodiment.

In order to prevent the moiré pattern appearing in the sensed image, the light sensing areas, i.e., the apertures formed by the metal wires, may be turned by an angle. As for each sensing element, the corresponding light sensing area is an area where the sensing element can receive lights, and the regions outside the light sensing areas may be blocked by the metal wires in the metal layer; hence, each aperture may be disposed to have an angle deviated from the corresponding sensing element. This limits the lights received by the sensing elements. As mentioned above, the lights reflected from the touch finger may pass through the grille patterns of the display panel and the sensing pixels. Since the aperture on each light path has a turning angle relative to the grille pattern of the display panel, the received light may be limited in a specific angle that may not be interfered with the pattern of the display panel; hence, the problem of moiré pattern may be prevented.

In such a situation, if the sensing pixels and the corresponding sensing elements are arranged as a 2-dimensional array along x-direction and y-direction, the metal wires forming the apertures are disposed along directions other than x-direction and y-direction, as can be considered as being turned from the normal direction. As shown in FIG. 4, the metal wires may be disposed throughout regions other than the apertures of the light sensing areas. In an embodiment, all of these metal wires may be disposed along directions other than x-direction and y-direction.

Figure 5:
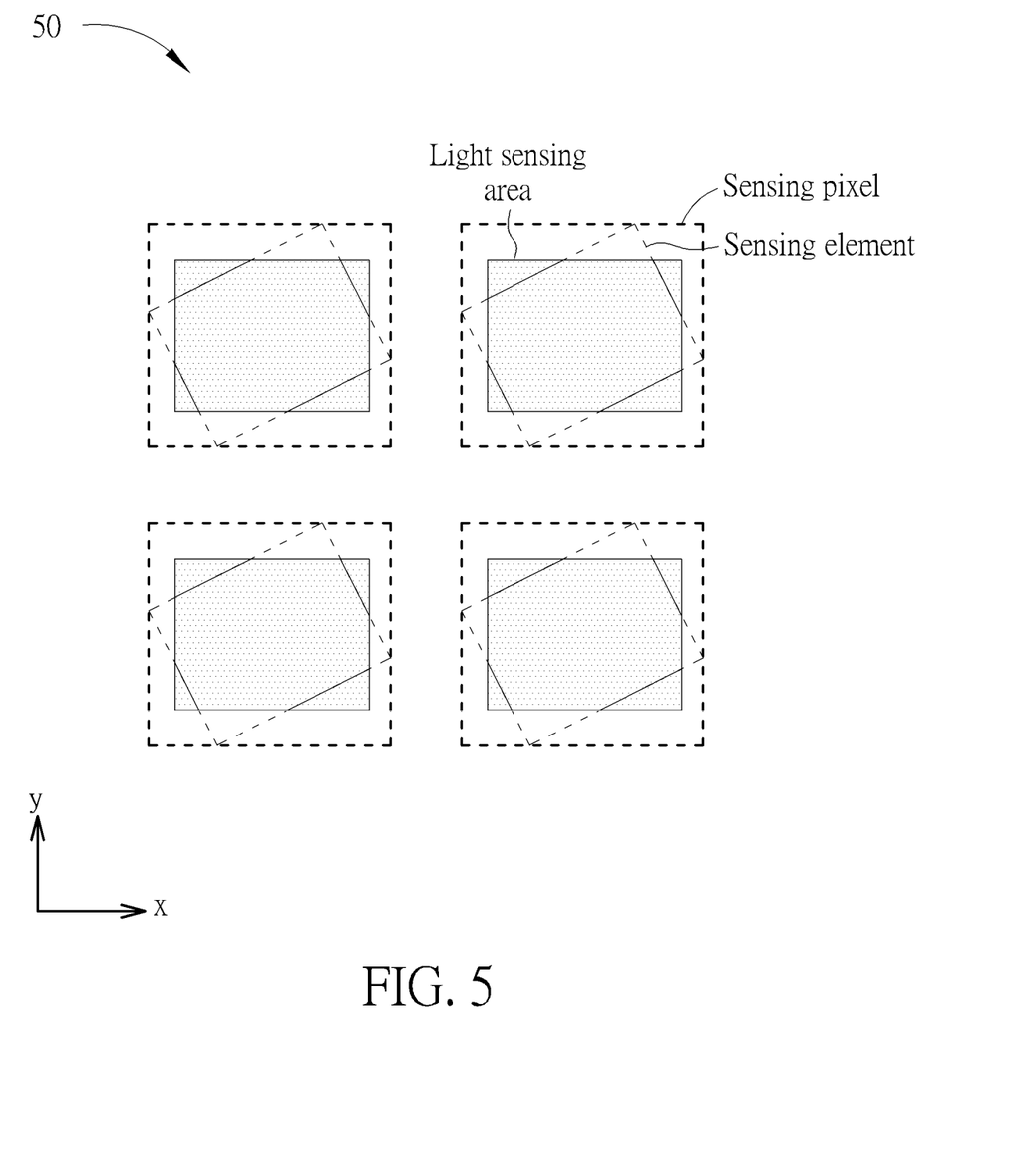
FIG. 5 is a schematic diagram of another image sensor according to an embodiment of the present invention.

Please note that the above implementation of turning the metal wires and the apertures is one of various embodiments of the present invention, and the problem of moiré pattern may be prevented by turning any elements or devices on the light path. Please refer to FIG. 5, which is a schematic diagram of another image sensor 50 according to an embodiment of the present invention. As shown in FIG. 5, the image sensor 50, which may be a sensor IC, includes a plurality of sensing pixels arranged as a 2-dimensional array. For the purpose of simplicity, only 4 sensing pixels are illustrated. Nevertheless, those skilled in the art should understand that there may be hundreds or thousands of sensing pixels in the image sensor 50. Similar to the image sensor 40, each sensing pixel of the image sensor 50 also includes a sensing element such as a photodiode. Each sensing element has a light sensing area defined by an aperture formed by metal wires. In other words, the image sensor 50 includes a sensor layer and at least one metal layer, where the sensor layer has the sensing elements in the sensing pixels, and the metal layer includes metal wires configured to form apertures superposed on the sensing elements in the sensor layer. Each aperture is configured to pass lights to one of the sensing elements.

In the image sensor 50, the sensing elements are turned by an angle. This limits the lights received by the sensing elements. As mentioned above, the lights reflected from the touch finger may pass through the grille patterns of the display panel and the sensing pixels. Since each sensing element has an angle relative to the grille pattern of the display panel, the received light may be limited in a specific angle that may not be interfered with the pattern of the display panel; hence, the problem of moiré pattern may be prevented.

In such a situation, if the sensing pixels and the corresponding sensing elements are arranged as a 2-dimensional array along x-direction and y-direction, a border of the sensing elements may be disposed along a direction other than x-direction and y-direction, as can be considered as being turned from the normal direction. As shown in FIG. 5, all borders of the sensing elements may be disposed along directions other than x-direction and y-direction.

Figure 6:
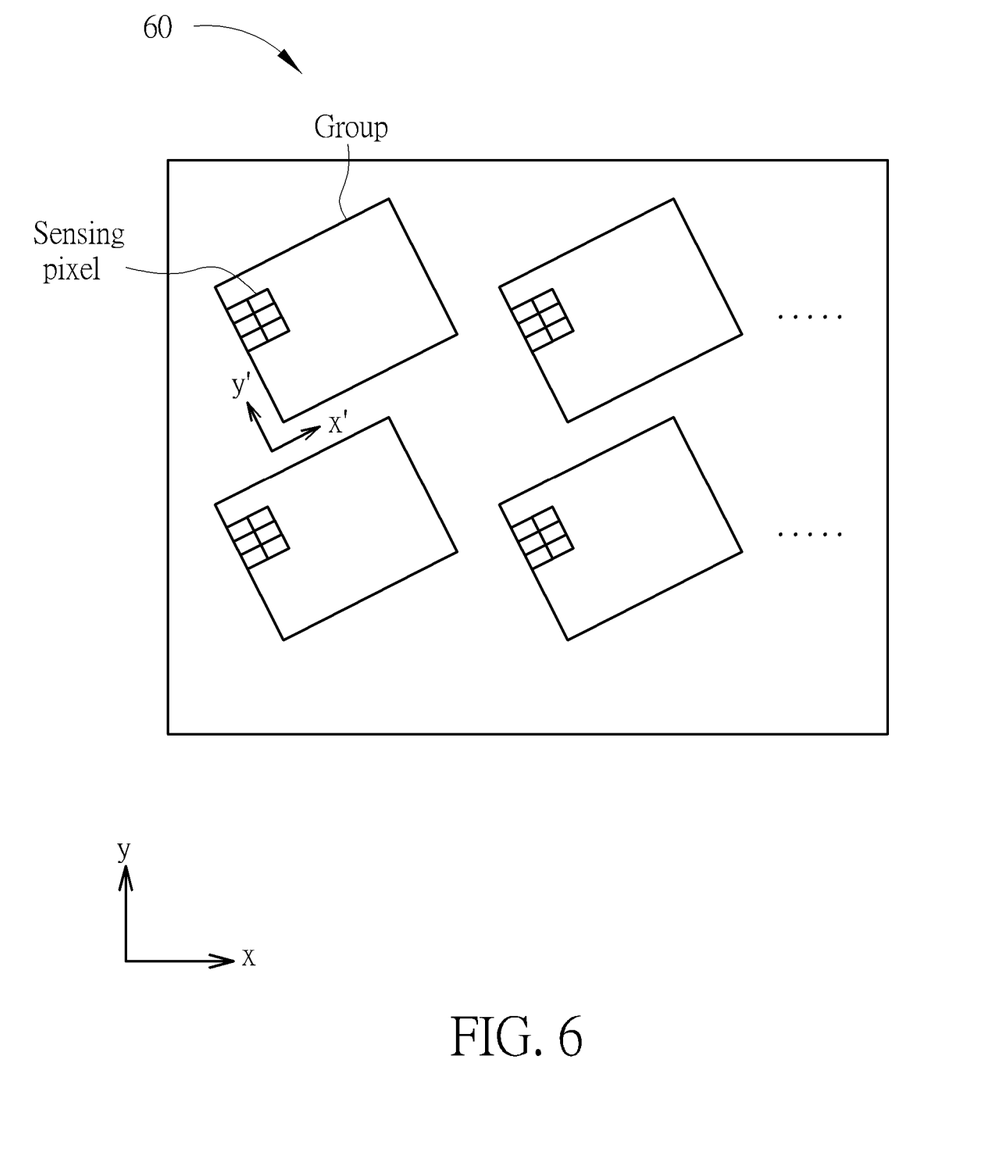
FIG. 6 is a further image sensor according to an embodiment of the present invention.

Please refer to FIG. 6, which is a further image sensor 60 according to an embodiment of the present invention. As shown in FIG. 6, the image sensor 60, which may be a sensor IC, includes a plurality of sensing pixels, each comprising a sensing element such as a photodiode. The sensing pixels and the corresponding sensing elements are divided into a plurality of groups. The sensing pixels and their sensing elements in each group are considered as being combined and turned to another angle. Each group is turned individually, to realize the arrangement as shown in FIG. 6. In addition, there may be at least one metal layer superposed on the sensor layer, and the metal wires in the metal layer are configured to form apertures corresponding to the positions of the sensing elements with a turning angle.

In such a situation, if the sensing pixel groups are arranged as a 2-dimensional array along x-direction and y-direction, the sensing elements in each group may be arranged as a 2-dimensional array along x'-direction and y'-direction, which are different from the x-direction and y-direction. The borders of the sensing elements may be disposed along x'-direction and y'-direction. Correspondingly, the metal wires forming the apertures superposed on the sensing elements may be disposed along x'-direction and y'-direction.

Please note that the present invention aims at providing a fingerprint image sensor which is capable of solving the problem of moiré pattern without increasing the chip size of the sensor IC. Those skilled in the art may make modifications and alternations accordingly. For example, the moiré effect may be mitigated or eliminated by disposing any elements on the light path with a turning angle. The turning angle may be configured arbitrarily, as long as the moiré effect may be mitigated. In an embodiment, an algorithm may be incorporated at the back end to deal with the remaining moiré pattern after being mitigated by the turning disposition. In addition, after the apertures and/or the sensing elements change their directions, the sensed light strength may be reduced due to decreasing of effective sensing area. The reduction of sensed light strength may be easily compensated in the back-end processor.

In the embodiments of the present invention, the direction change of metal wires, sensing elements, or both, may be realized by using layout techniques. With the flexibility of circuit layout in the chip, after a sensing element or a group of sensing elements are disposed with a turning angle, other circuit elements and corresponding connection wires may be filled in vacant areas outside the sensing elements, so as to efficiently utilize the circuit area in the chip. In such a situation, the implementations of the present invention may not generate a waste on the usage of circuit area, and thus the chip size may not be expanded. In comparison with the prior art case where the chip size may be up to 20.9 mm×15.24 mm, the embodiments of the present invention do not require turning of the die, allowing the total chip size to be approximately equal to the die size, i.e., 18.69 mm×11.31 mm, which has approximately 34% reduction of the chip size. As a result, the present invention may save the chip area, and the package may be smaller to conform to the chip size, allowing the design of end products to be more flexible and the usage of space to be more efficiency. The system costs may also be saved.

To sum up, the present invention provides a fingerprint image sensor which is capable of solving the problem of moiré pattern without increasing the chip size of the sensor IC. In an embodiment, the metal wires forming the apertures for passing light to the sensing elements may be disposed with a turning angle, i.e., direction change. Alternatively or additionally, the sensing elements may be disposed with a turning angle, i.e., direction change. The direction change may be performed individually on each sensing pixel, or a plurality of sensing pixels may be combined as a group and turned together. The lights reflected from the touch finger may pass through the apertures and then be received by the sensing elements. The direction change of the metal wires and/or the sensing elements may limit the received light in a specific angle that may not be interfered with the pattern of the display panel; this prevents the problem of moiré effect. Therefore, the moiré pattern may be mitigated or eliminated by turning the direction of the sensing pixels; hence, the chip size may not be expanded and the system costs may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor, comprising:
   a sensor layer, comprising a plurality of sensing elements arranged as a 2-dimensional array along a first direction and a second direction; and
   a metal layer, comprising a plurality of metal wires configured to form a plurality of apertures superposed on the plurality of sensing elements;
   wherein at least one of the plurality of metal wires forming the plurality of apertures is entirely disposed along a third direction different from the first direction and the second direction.

2. The image sensor of claim 1, wherein none of the plurality of metal wires forming the plurality of apertures is disposed along the first direction or the second direction.

3. The image sensor of claim 1, wherein a border of the plurality of apertures is disposed to have an angle deviated from a border of a corresponding sensing element among the plurality of sensing elements.

4. The image sensor of claim 3, wherein the angle is greater than 15 degrees.

5. The image sensor of claim 1, wherein each of the plurality of apertures is configured to pass lights to a superposed sensing element among the plurality of sensing elements.

6. An image sensor, comprising:
   a sensor layer, comprising a plurality of sensing elements arranged as a 2-dimensional array along a first direction and a second direction, the plurality of sensing elements having a plurality of borders; and
   a metal layer, comprising a plurality of metal wires configured to form a plurality of apertures superposed on the plurality of sensing elements;
   wherein a majority of the borders of the plurality of sensing elements are disposed along a third direction and a fourth direction different from the first direction and the second direction.

7. The image sensor of claim 6, wherein none of the borders of the plurality of sensing elements is disposed along the first direction or the second direction.

8. The image sensor of claim 6, wherein one of the borders of the plurality of sensing elements is disposed to have an angle deviated from a border of the corresponding aperture among the plurality of apertures.

9. The image sensor of claim 8, wherein the angle is greater than 15 degrees.

10. The image sensor of claim 6, wherein each of the plurality of apertures is configured to pass lights to a superposed sensing element among the plurality of sensing elements.

11. An image sensor, comprising:
    a sensor layer, comprising a plurality of sensing elements divided into a plurality of groups, wherein the plurality of groups are arranged as a 2-dimensional array along a first direction and a second direction; and
    a metal layer, comprising a plurality of metal wires configured to form a plurality of apertures superposed on the plurality of sensing elements;

wherein the sensing elements in each of the plurality of groups are arranged as a 2-dimensional array along a third direction and a fourth direction, wherein each of the third direction and the fourth direction is different from the first direction and the second direction.

12. The image sensor of claim 11, wherein each of the plurality of metal wires forming the plurality of apertures is disposed along the third direction or the fourth direction.

13. The image sensor of claim 12, wherein the third direction and the fourth direction are respectively deviated from the first direction and the second direction with an angle.

14. The image sensor of claim 13, wherein the angle is greater than 15 degrees.

15. The image sensor of claim 11, wherein each border of the plurality of sensing elements is disposed along the third direction or the fourth direction.

16. The image sensor of claim 15, wherein the third direction and the fourth direction are respectively deviated from the first direction and the second direction with an angle.

17. The image sensor of claim 16, wherein the angle is greater than 15 degrees.

18. The image sensor of claim 11, wherein each of the plurality of apertures is configured to pass lights to a superposed sensing element among the plurality of sensing elements.

* * * * *